United States Patent [19]
Nakasuji

[11] Patent Number: 5,629,526
[45] Date of Patent: May 13, 1997

[54] ELECTRO-MAGNETIC LENS, CHARGED PARTICLE BEAM TRANSFERRING APPARATUS, AND METHOD FOR MANUFACTURING ELECTRO-MAGNETIC LENS

[75] Inventor: Mamoru Nakasuji, Yokohama, Japan

[73] Assignee: Nikon Corporation, Tokyo, Japan

[21] Appl. No.: 459,265

[22] Filed: Jun. 2, 1995

Related U.S. Application Data

[63] Continuation-in-part of Ser. No. 310,985, Sep. 23, 1994, abandoned.

[30] Foreign Application Priority Data

Sep. 28, 1993 [JP] Japan .................................. 5-240867
Oct. 27, 1994 [JP] Japan .................................. 6-263609

[51] Int. Cl.⁶ .................................................. H01J 37/141
[52] U.S. Cl. .............................. 250/396 ML; 335/210
[58] Field of Search ..................... 250/396 ML; 335/210

[56] References Cited

U.S. PATENT DOCUMENTS

| | | | |
|---|---|---|---|
| 2,637,000 | 4/1953 | Page | 250/396 ML |
| 4,785,176 | 11/1988 | Frosien et al. | 250/396 ML |
| 5,057,689 | 10/1991 | Nomura et al. | 250/396 ML |
| 5,334,282 | 8/1994 | Nakayama et al. | 250/492.23 |
| 5,382,800 | 1/1995 | Nishino et al. | 250/396 ML |

FOREIGN PATENT DOCUMENTS

54-128679  10/1979  Japan .............................. 250/396 ML

*Primary Examiner*—Jack I. Berman
*Attorney, Agent, or Firm*—Shapiro and Shapiro

[57] ABSTRACT

A charged particle beam transferring apparatus includes a pair of electro-magnetic lenses spaced apart in the direction of the optical axis. Each electro-magnetic lens consists of a coil and core made of magnetic material and having two magnetic poles. The core of at least one of the electro-magnetic lenses is made of ferrite. An insulating member supports the two magnetic poles of the core of the at least one of the electro-magnetic lenses between its two magnetic poles.

25 Claims, 4 Drawing Sheets

ELECTRO-MAGNETIC LENS, CHARGED PARTICLE BEAM TRANSFERRING APPARATUS, AND METHOD FOR MANUFACTURING ELECTRO-MAGNETIC LENS

This application is a continuation-in-part of application Ser. No. 08/310,985 filed Sep. 23, 1994, now abandoned.

BACKGROUND OF THE INVENTION

Field of the Invention

The present invention relates to a charged particle beam transferring apparatus for manufacturing micro-devices such as a semiconductor device, an electro-magnetic lens to be used in said apparatus, and a method for manufacturing said electro-magnetic lens. The invention relates more particularly to a charged particle beam transferring apparatus having high throughput, an electro-magnetic lens having a high response speed (which is capable of, for example, varying its focal length at a high speed), and a method for manufacturing said electro-magnetic lens.

Related Background Art

An electro-magnetic lens (referred to as "magnetic lens" hereinafter) comprises a coil and a core having two magnetic poles. In this magnetic lens, the intensity of the magnetic field on the axis of the magnetic lens is varied by changing a current flowing through the coil, whereby the focal length of the magnetic lens is adjusted.

The core is made of a magnetic material. Particularly, it is made of soft iron or Permalloy (trade name—a nickel alloy having high magnetic permeability), because large magnetic stresses are applied to the magnetic poles.

An electron beam demagnification transferring apparatus and an ion beam demagnification transferring apparatus are known as charged particle beam transferring apparatuses, and both transferring apparatuses are objects of the present invention. However, an electron beam demagnification transferring apparatus will be described as a representative of the charged particle beam transferring apparatus.

In the electron beam demagnification transferring apparatus, a pattern transferred onto a wafer is divided to form a plurality of sub-fields on a mask. Transfer is carried out by emission of electron beams to each sub-field. The emission of electron beams to the sub-fields is achieved by continuous movement, in a predetermined direction, of a mask stage on which the mask is loaded, and by deflection of the beams with a first deflector in association with the continuous movement of the mask stage. The electron beams which have passed through the sub-fields are emitted onto predetermined portions of a photosensitive member (wafer) in the following way. The magnification of a bundle of the electron beams is reduced by two magnetic lenses. A stage on which the photosensitive member is loaded is moved continuously in the reverse direction to the moving direction of the master (mask) stage, and a second deflector is operated to deflect the beams in association with the continuous movement of the stage carrying the photosensitive member. In this way, the electron beams are emitted onto the predetermined portions of the photosensitive member. Since the optical paths from the sub-fields to the photosensitive member differ from sub-field to sub-field in this structure, the focal lengths of the paired magnetic lenses must be adjusted for the respective sub-fields. Thus, the electron beams are emitted from a predetermined sub-field after the focal lengths of the paired magnetic lenses have been adjusted.

The paired magnetic lenses are arranged along the optical axis. The focal lengths of the paired magnetic lenses are adjusted by changing the currents flowing through their coils.

Soft iron or Permalloy per se of which a magnetic lens core is made has a frequency characteristic of 20 Hz or so. Thus, the conventional magnetic lens has a problem in that it takes more than 50 msec to stabilize the magnetic field produced in the magnetic poles after the current flowing through the coil has been changed.

The current is varied according to the individual sub-fields in the conventional charged particle beam transferring apparatus so as to adjust focal length of the magnetic lens for each of the sub-fields, and the operator must wait until the magnetic field is stabilized every time the current is changed. Therefore, the conventional magnetic lens presents problems in that it takes a long time to stabilize the magnetic field and the throughput is lowered.

SUMMARY OF THE INVENTION

An object of the present invention is to provide an electro-magnetic lens having a high response speed.

Another object of the present invention is to provide an electro-magnetic lens having high performance which can render a less-deformed image, etc.

Still another object of the present invention is to provide a charged particle beam transferring apparatus capable of a high throughput.

Still another object of the present invention is to provide a charged particle beam transferring apparatus which can render a less-deformed pattern image of high quality.

Still another object of the present invention is to provide a method for manufacturing an electro-magnetic lens of high performance which can render a less-deformed image, etc.

A first magnetic lens according to the present invention includes a coil and a core of a magnetic material comprising two magnetic poles, and the core is made of ferrite. The two magnetic poles are supported by an insulating member disposed between the magnetic poles or in the vicinity thereof.

A second electro-magnetic lens according to the present invention includes a coil and a core of a magnetic material comprising two magnetic poles, the core is made of ferrite, and at least part of said core is covered with a layer of ferromagnetic material. Said ferromagnetic material preferably is a magnetic material with less hysteresis, and more preferably is at least one of iron, Permalloy, monocrystalline ferrite, and ferric nitride expressed by the chemical formula $FeN_x$ (where $0 < x \leq 1$).

A first charged particle beam transferring apparatus according to the present invention operates to emit, to a photosensitive member, charged particle beams, which have passed through a mask having a transfer pattern, through a pair of magnetic lenses spaced apart in the direction of the optical axis and each including a coil and a core made of a magnetic material and having two magnetic poles. The core of at least one of the paired magnetic lenses is made of ferrite. The two magnetic poles are supported by an insulating member disposed between the two magnetic poles or in the vicinity thereof.

A second particle beam transferring apparatus according to the present invention operates to emit, to a photosensitive member, charged particle beams, which have passed through a mask, through a pair of electro-magnetic lenses spaced apart in the direction of the optical axis and each including a coil and a core made of a magnetic material and having two magnetic poles. The core of at least one of the paired electro-magnetic lenses is made of ferrite, and at least part of the surface of said core is covered with a layer of a ferromagnetic material.

A first method for manufacturing an electro-magnetic lens according to the present invention includes steps to cover at least part of the surface of a core made of ferrite and having two magnetic poles with a layer made of a ferromagnetic material through an adhesive, and thereafter to load the coil on said layer.

A second method for manufacturing an electro-magnetic lens according to the present invention includes steps to form a thin film layer of a ferromagnetic material on at least part of the surface of the core which is made of a magnetic material and has two magnetic poles, by at least one of the methods including plating, vacuum evaporation, deposited injection, ion beam evaporation, sputtering and reactive sputtering, and thereafter to load the coil on said thin film layer.

The first magnetic lens according to the present invention has a core made of ferrite. Since the frequency characteristic of ferrite is on the order of 200 [KHz], it takes only 5 [μsec] or so to stabilize the magnetic field after the current flowing through the coil has been changed. Thus, the response speed of the magnetic lens according to the present invention is greater than that of the conventional magnetic lens. Also, supporting of the magnetic poles by use of the insulating member between the magnetic poles or in the vicinity thereof prevents the core of the magnetic lens, which is made of ferrite, from being broken by the magnetic stress.

In the inner part of the sintered material called ferrite, spaces called voids intrinsic to ceramics are distributed at high density. For this reason, when the surface of this material is polished, a lot of cross sections of the voids appear on the surface, and the surface cannot be finished as a mirror surface. When many recesses are generated on the gap surface or the bore of the electro-magnetic lens, axial symmetry of the electro-magnetic lens is lost because of the recesses. Image deformation or the like caused by the loss of axial symmetry may become a problem depending on a type of performance required for said electro-magnetic lens.

However, in the second electro-magnetic lens according to the present invention, the surface of the core made of ferrite is covered with a ferromagnetic material of uniform composition. Therefore, even if there are voids in the inner part of said core, the surface of the core can be finished as a mirror surface. For this reason, the core surface is smooth without recesses (voids). In this manner, excellent lens characteristics including a high response speed, less image deformation and high resolving power can be obtained.

In the second electro-magnetic lens according to the present invention, the entire surface of the core may be covered with a ferromagnetic material, or only a part of said surface such as the gap surface and/or inner surface of the bore which gives the most important influence to the lens characteristics may be covered with a ferromagnetic material.

When a current flowing through the coil of the electro-magnetic lens is changed in order to adjust the focal length, a magnetic flux passing through the ferrite and a magnetic flux passing through spaces outside the ferrite, and thus the magnetic field which is caused by the two magnetic poles of the core, make a response to said change in a short period of several μ sec. On the other hand, a response characteristic of the thin layer of a ferromagnetic material is reduced as an eddy current flows through said layer. In the case of an electro-magnetic lens which is made of a plurality of magnetic materials (such as ferrite and a thin ferromagnetic material), however, the response characteristic in relation to a change in the current is represented by a weighted average of the time constants of the respective materials with respect to the lengths of the corresponding magnetic paths. Therefore, when ferrite having an extremely high response characteristic is used for the core, even if a film made of a ferromagnetic material having a poor response characteristic, for example, is covered on the surface of the core, a ratio between the thickness of the film made of the ferromagnetic material and the length of the entire magnetic path (the thickness of the film of the ferromagnetic material/the length of the entire magnetic path) is satisfactorily small. More specifically, the response is reduced only in a magnetic path over a length of the order of 10 to 100 μm of the ferromagnetic material out of the entire magnetic path of 1 m or so. Therefore, even if the response characteristic of the ferromagnetic material is poor, the influence thereof is negligible. Thus, an excellent response characteristic substantially the same as that of the first electro-magnetic lens can be obtained even by the second electro-magnetic lens.

Furthermore, the ferromagnetic material is at least one of magnetic materials with less hysteresis such as iron, Permalloy, monocrystalline ferrite, and ferric nitride expressed by the chemical formula FeNx (where $0<x\leq 1$). Such magnetic materials can readily be obtained inexpensively and can be easily processed. Moreover, a strong magnetic force can be obtained by such materials.

In the first charged particle beam transferring apparatus according to the present invention, at least one of the paired magnetic lenses comprises the first magnetic lens as described above. When the current flowing through the coils of the paired magnetic lenses is adjusted, the magnetic field is stabilized quickly and thus high throughput is attained. As only the insulating member is previously disposed between the coils and the electron beams passing through the magnetic lenses, no influence occurs due to an eddy current that would otherwise be produced if an electrically conductive material is placed there. In consequence, the response speed of the magnetic field is not lowered when the currents of the magnetic lenses are changed.

In the second charged particle beam transferring apparatus according to the present invention, the second electro-magnetic lens mentioned above is used as at least one of said paired electro-magnetic lenses. For this reason, the core surface of the electro-magnetic lens can be finished as a mirror surface, whereby a pattern image with extremely small deformation, or the like (i.e., with high quality) and high resolving power can be obtained. Even if a current flowing through the electro-magnetic lens is adjusted for each sub-field, the response speed can be made high and the throughput can be improved.

By the first method for manufacturing an electro-magnetic lens according to the present invention, a layer of a ferromagnetic material is covered onto the surface of a core made of ferrite by using an adhesive. For this reason, an electro-magnetic lens which is easy to be manufactured and has a stable performance can be manufactured without expensive production equipment.

By the second method for manufacturing an electro-magnetic lens according to the present invention, a thin film layer made of a ferromagnetic material is formed on the surface of a core made of ferrite by the method called thin film formation. Therefore, a uniform film can be formed on the core surface and, moreover, a very thin film can be easily formed.

DETAILED DESCRIPTION OF THE PREFERRED EMBODIMENTS

Figure 1:
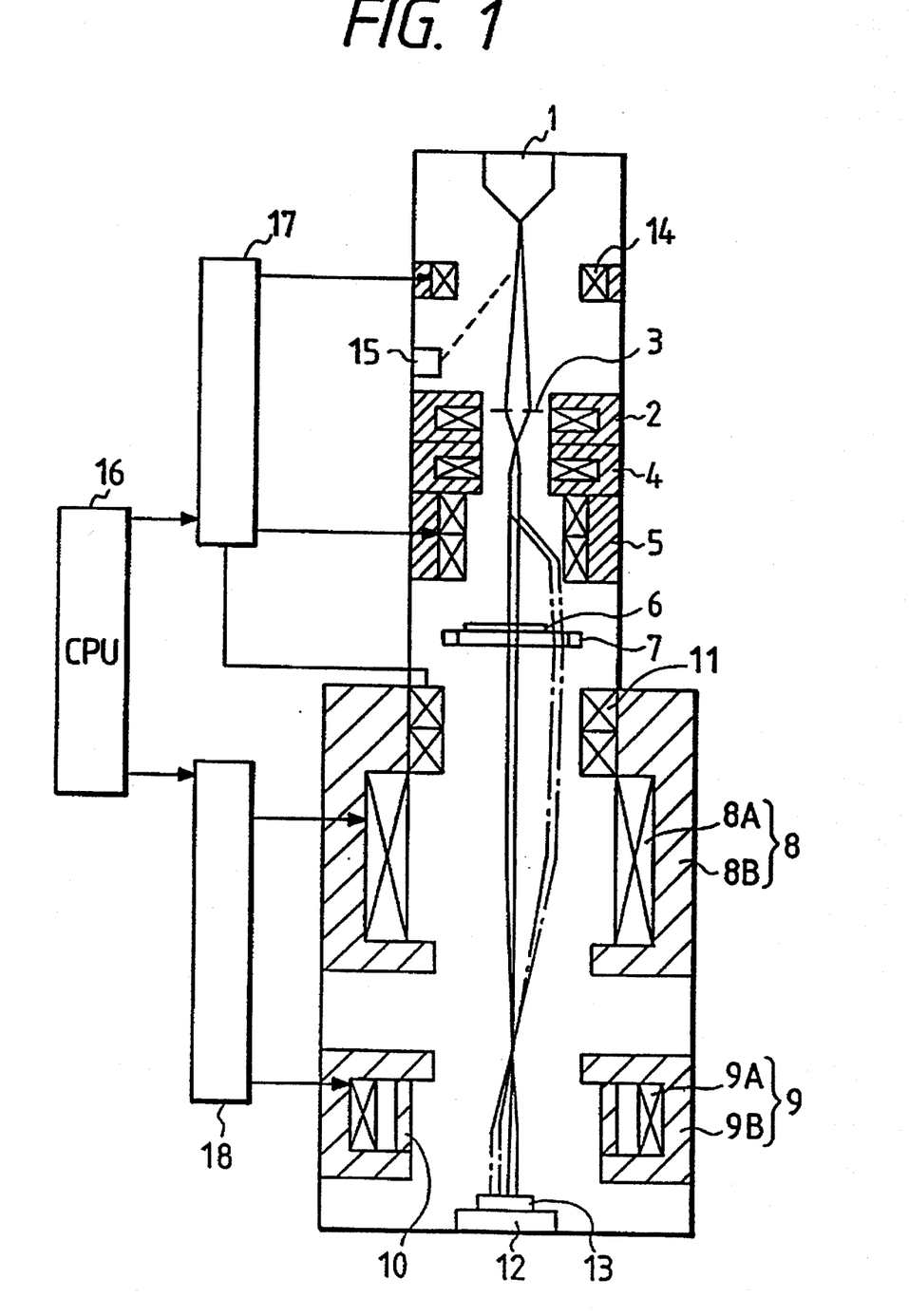
FIG. 1 is a general view of an electron beam demagnification transferring apparatus according to one embodiment of the present invention.

FIG. 1 is a general view of an electron beam demagnification transferring apparatus according to one embodiment of the present invention. A first condenser lens 2 converges electron beams emitted from an electron gun 1 and allows the electron beams to pass through the opening of an aperture 3 to form a crossover. A second condenser lens 4 converts the electron beams forming the cross-over into parallel beams. A first deflector 5 deflects the parallel beams two-dimensionally. The electron beams formed into parallel beams by the two-dimensional deflection and continuous movement, in a predetermined direction, of a mask stage 7 on which a mask 6 is loaded, are emitted on predetermined areas of the mask 6 in succession. A transfer pattern is formed on the mask 6 and is divided into a plurality of areas (hereinafter referred to as "sub-fields") transferred by corresponding emission of electron beams. The mask stage 7 is driven by a driving motor (not shown).

A first magnetic lens 8 and a second magnetic lens 9 reduce the diameters of the electron beams which have passed through the corresponding sub-fields and project the same on wafer 13. The first magnetic lens 8 and the second magnetic lens 9 comprise coils 8A and 9A and cores 8B and 9B made of ferrite and each having two magnetic poles. An insulating member 10 is disposed between the magnetic poles of the second magnetic lens 9 to support them. The insulating member 10 is made of alumina ceramics.

A second deflector 11 includes, as a core, the magnetic pole of the core 8B of the first magnetic lens 8 at the side of the mask 6. The second deflector 11 deflects the electron beams which have passed each sub-field in accordance with the magnification of the first magnetic lens 8 and the second magnetic lens 9. The pattern of the sub-field is transferred to the predetermined portion of the wafer 13 loaded on a wafer stage 12 by the deflection of the second deflector 11 and by successive movement of a wafer stage 12 to be later explained.

The pattern of the sub-field is inverted by the first magnetic lens 8 and the second magnetic lens 9. Thus, the wafer stage 12 is continuously moved in the reverse direction to the direction of continuous movement of the master stage 7. The wafer stage 12 is driven by a driving motor (not shown).

A required pattern can be formed on the wafer 13 by successively irradiating the patterns of the sub-fields with electron beams. A blanking deflector 14 deflects the electron beams toward a beam catcher 15 so that the electron beams are not emitted to the mask until the emitting condition of the electron beams to the sub-fields is set.

A CPU 16 performs various arithmetic operations to form the required pattern on the Wafer 13 and controls a deflector driving circuit 17 and a focus adjusting circuit 18. The deflector driving circuit 17 controls the first deflector 5, the second deflector 11 and the blanking deflector 14 in response to the instructions from the CPU 16. The focus adjusting circuit 18 controls the currents provided to the first magnetic lens 8 and the second magnetic lens 9 in response to the instructions from the CPU 16 so as to adjust the focal length.

The operation of the so-constructed electron beam demagnification transferring apparatus will be described.

The electron beams emitted from the electron gun 1 pass through the first condenser lens 2, the aperture 3 and the second condenser lens 4. The CPU 16 controls the amount of deflection of the first deflector 5 by the use of the deflector driving circuit 17 so that the electron beams are emitted on the predetermined sub-field. The optical paths from the corresponding sub-fields to the wafer 13 vary depending on the amounts of deflection. Thus, the CPU 16 controls the currents supplied to the first magnetic lens 8 and the second magnetic lens 9 by the use of the focus adjusting circuit 18 so as to adjust the focal length.

In this embodiment, the cores 8B and 9B of the first magnetic lens 8 and the second magnetic lens 9 are made of ferrite. In this regard, it takes only 5 μsec or so to stabilize the magnetic field generated on the optical axis of the cores 8B and 9B when the focal length is adjusted by changing the currents flowing through the coils 8A and 9A of the first magnetic lens 8 and the second magnetic lens 9. Since the time for deflecting electron beams by the blanking deflector 14 is reduced, the continuous moving velocities of the mask stage 7 and the wafer stage 12 can be made faster, thereby attaining high throughput.

When the distance between the magnetic poles is small, particularly strong magnetic stresses are applied to the magnetic poles. As the magnetic poles of the core 9B of the second magnetic lens 9 are supported by the insulating member 10 made of alumina ceramics in this embodiment, the core 9B of ferrite is not broken. The insulating member 10 of alumina ceramics is cylindrical in this embodiment, but may be of a plate-like shape as long as it can support the magnetic poles fully.

Only the insulating member 10 of alumina ceramics is disposed between the electron beams passing through the second magnetic lens 9 and the coil 9A of the second magnetic lens 9. Thus, no influence occurs due to eddy currents that would be produced if an electrically conductive member is placed there. In this connection, the response speed of the magnetic field is not lowered when the current flowing through the coil 9A of the second magnetic lens 9 is changed.

The magnetic poles of the core 9B of the second magnetic lens 9 are supported by the insulating member 10 of alumina ceramics in this embodiment, but the magnetic poles of the core 8B of the first magnetic lens 8 may be also supported by an insulating member made of alumina ceramics similar to the insulating member 10.

Figure 2:
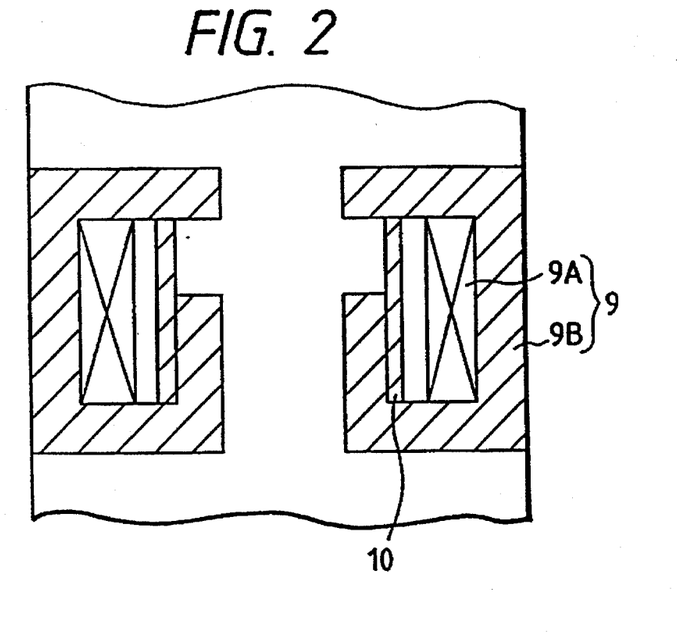
FIG. 2 shows a second magnetic lens according to a first modification of the present invention.

FIG. 2 shows a first modification of the present invention, in which an insulating member 10 made of alumina ceramics for the second magnetic lens 9 is disposed close to the magnetic poles so as to prevent breakage of the core 9B made of ferrite. Thus, the first modification of the present invention in which the insulating member 10 made of alumina ceramics is disposed close to the magnetic poles, exhibits the same effect as the first embodiment of the present invention. The structure of the first modification other than the second magnetic lens 9 is the same as the apparatus shown in FIG. 1.

Figure 3:
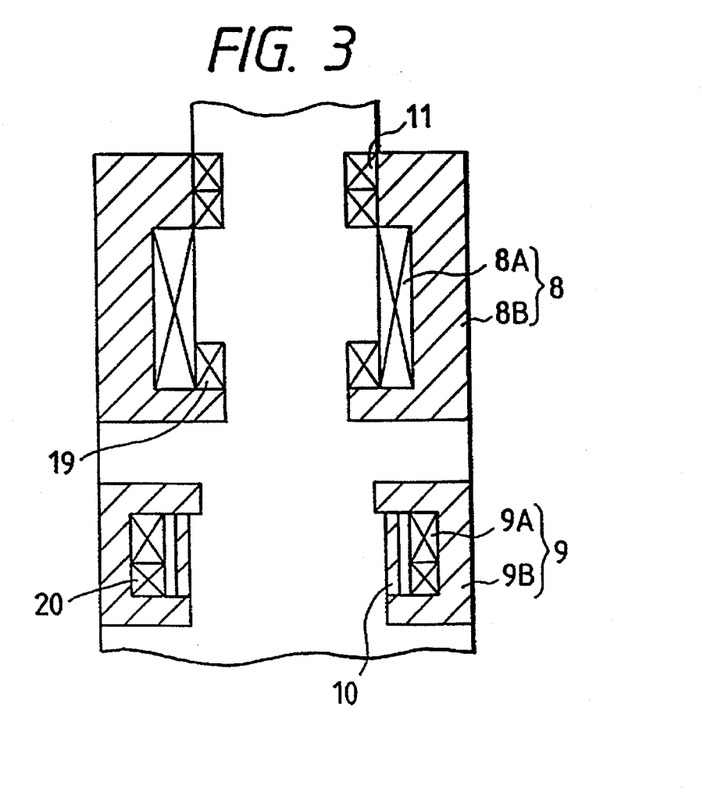
FIG. 3 shows a first magnetic lens and a second magnetic lens according to a second modification of the present invention.

FIG. 3 shows a second modification of the present invention, wherein a first magnetic lens 8 and a second magnetic lens 9 are provided with coils 19 and 20 for adjusting focuses for sub-fields, respectively. A focus adjusting circuit 18 (FIG. 1) controls currents flowing through the coils 19 and 20 for adjusting the focuses for the respective sub-field. The other structure of the second modification is the same as that of the apparatus shown in FIG. 1.

The adjusted amounts of the focal lengths for the sub-fields are not large. Thus, in the second modification, only the currents flowing through the coils 19 and 20 are adjusted, while keeping the currents flowing through the coils 8A and 9A of the first magnetic lens 8 and the second magnetic lens 9 constant. In this arrangement, the focus adjusting circuit 18 can control the coils 19 and 20 with small currents.

Figure 4:
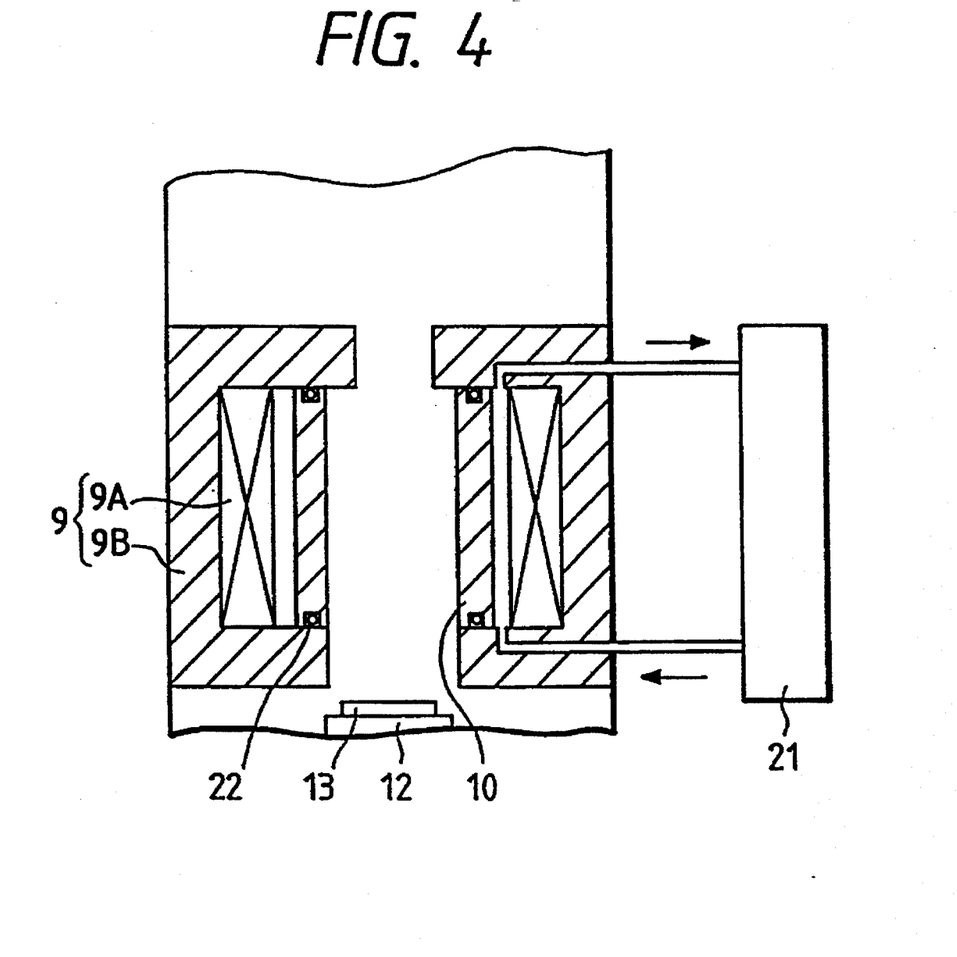
FIG. 4 shows a second magnetic lens and a cooling device according to the present invention.

FIG. 4 shows a cooling device of a second magnetic lens 9. The cooling device 21 supplies water at a constant temperature to the second magnetic lens 9. O-rings 22 act as seals for preventing the constant temperature water from leaking to the electron optical system.

The cooling device is provided to avoid deterioration of the transfer accuracy that could be caused by dimensional changes of the wafer 13 due to heat absorption. More particularly, the size of the second magnetic lens 9 measured along its optical axis is so small that heat generated by the current flowing through coil 9A cannot be dissipated fully. Also, the second magnetic lens 9 is disposed close to the wafer 13. The cooling device prevents heat of the second magnetic lens 9 from being transmitted to the wafer 13.

The constant temperature water sent out from the cooling device 21 enters, from below, the second magnetic lens 9 disposed close to the wafer 13. The water flows through a space between a coil 9A and a cylindrical insulating member 10 made of alumina ceramics and returns to the cooling device 21 from the upper portion of the second magnetic lens 9. In this modification, the coil 9A is coated with polyimide (not shown), and the constant temperature water is caused to flow through a space between the coil 9A and the core 9B. In this way, the heat generated in the coil can be removed efficiently without splashing the constant temperature water on the coil itself.

The insulating member 10 made of alumina ceramics is formed into a cylindrical shape, and O-ring grooves are formed in the upper face and the lower face of the insulating member 10. In order to prevent the constant temperature water from leaking into the electron optical system, the O-rings 22 are provided between the magnetic poles and the insulating member 10 made of alumina ceramics to effect a seal therebetween.

Naturally, the first magnetic lens 8 may be cooled in the same way as is explained above.

In this modification, the core of a second deflector 11 is also common to the core of the first magnetic lens 8 made of ferrite. Thus, the response of the second deflector 11 is improved. The core of a first deflector 5 is also made of ferrite so that the response is improved and high throughput can be obtained.

Figure 5:
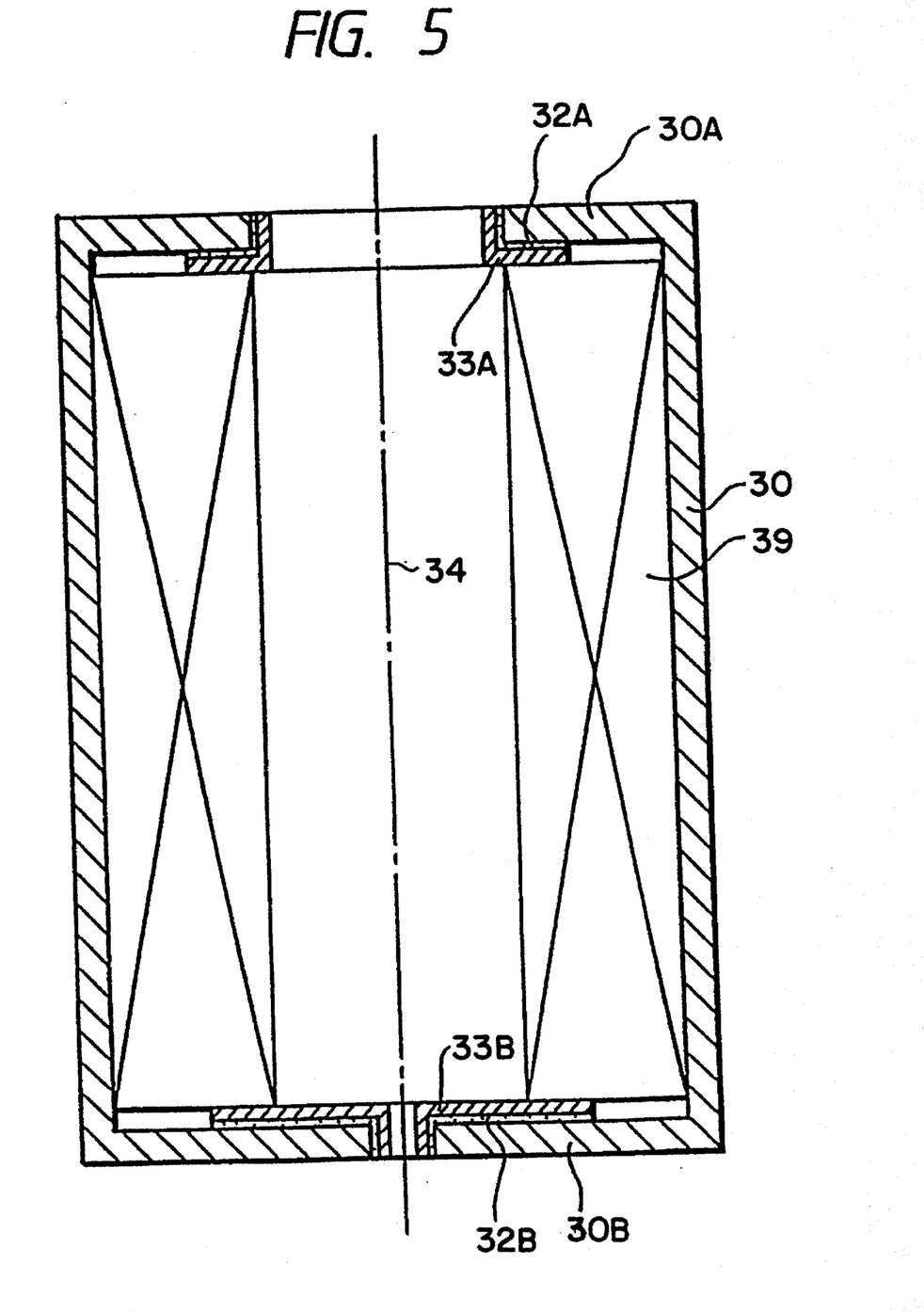
FIG. 5 is a cross-sectional view showing a schematic arrangement of an electro-magnetic lens according to a second embodiment of the present invention.

Next, the second embodiment of the present invention will be described below with reference to FIG. 5. FIG. 5 is a view showing a cross-sectional shape of an electro-magnetic lens according to the second embodiment. As shown in FIG. 5, the electro-magnetic lens has a cylindrical form as a whole which is centered around an axis of symmetry 34. The lens is mainly comprised of a core 30 made of ferrite, and a coil 39 for excitation loaded inside the core 30. On the top and the bottom of the core 30, there are projections respectively projecting substantially horizontally toward the axis of symmetry. These projections become an upper magnetic pole (an upper pole) 30a and a lower magnetic pole (a lower pole) 30b, respectively, due to the excitation by the coil 39.

A surface smoother 33A made of Permalloy (an alloy of nickel and iron) is attached to a surface (an inner surface of a bore) opposite to the axis of symmetry 34 of the magnetic pole 30a and to a surface (a gap surface) opposing an adjacent (upper as shown) end of the coil 39 through an adhesive 32A. A surface smoother 33B is attached to the magnetic pole 30b through an adhesive 32B in the same manner. In FIG. 5, the sizes of adhesives 32A and 32B and the surface smoothers 33A and 33B are exaggerated for convenience of illustration. The actual thickness of the adhesive 32A or 33B is 10 μm or less. The surface smoothers 33A and 33B are formed to a thickness of the order of 10 to 500 μm, and preferably to a thickness of 10 to 100 μm. The surfaces of the surface smoothers 33A and 33B which cover part of the core 30 are finished as a mirror surface without voids. Since the surface smoothers 33A and 33B have similar structure, description will be made below only of the surface smoother 33A as representative.

In addition to Permalloy, various kinds of ferromagnetic materials can be used for the surface smoother 33A. These ferromagnetic materials typically include iron, silicon steel sheet, iron alloys other than Permalloy, iron compounds such as ferric nitride (FeNx) and magnetic-permeable materials such as amorphous metal. Though, in the form shown, the surface of the core 30 made of ferrite is covered with the surface smoother 33A through the adhesive 32A, a film made of a ferromagnetic material as mentioned above may be formed as the surface smoother 33A on the surface of the core 30 made of ferrite, by a method of thin film formation as described later or by plating.

Next, methods for manufacturing the electro-magnetic lens of this embodiment will be described.

(A) Bonding

By the bonding method, the surface smoother 33A made of Permalloy, iron or other ferromagnetic material is bonded to all or part of the surface of the core 30 made of ferrite through the adhesive 32A. Taking the thicknesses of the adhesive 32A and of the surface smoother 33A into consideration, a bore diameter (a hole diameter) and a gap size of the core surface to be bonded are made to be a little larger, the surface smoother 33A is bonded to the core surface with the adhesive 32A, and thereafter the final process such as polishing is conducted to finish the core into final dimensions. Next, the coil 39 is attached to the inner surface of the core 30. In this case, the core 30 is shown as an integral component in FIG. 5, but the core 30 may be divided into a plurality of parts, for example, in order to make the assembly easier.

When monocrystalline ferrite is used as the ferromagnetic material, it is difficult to obtain a large-sized single crystal. Therefore, a thin-sliced single crystal is made fan-shaped and is bonded to the surface of the magnetic pole of ferrite. After that, the gap surface and the bore hole are polished.

As the adhesive 32A used in this embodiment, an adhesive capable of bonding metals together strongly and having high heat stability and durability is used. Examples of such adhesive are nylon adhesives, polyester adhesives, plastic solder, silicon RTV, adhesive for structures, PI (polyimide), ceramic adhesives, etc.

(B) Film Formation

By using any one of the methods for film formation such as vacuum evaporation, ion beam evaporation, deposited injection, sputtering and reactive sputtering, a film of a ferromagnetic material is formed on the surface of the core 30 by physicochemical absorption. When, for example, the film is to be formed by sputtering, a mixed gas of argon (Ar) and nitrogen (N₂) gases in a ratio of 10[Pa] and 1[Pa] is used as a discharge gas, the sputtering is effected on iron (Fe) as a target, and then a film made of ferric nitride which is expressed by the chemical formula FeNx (where $0<x\leq 1$) is formed on the surface of the core 30 made of ferrite. Then, the coil 39 is attached to the inner surface of the core 30, in the same manner as the above-mentioned bonding method (A).

(C) Plating

First, an alloy film of nickel and phosphorus (Ni.P) is plated to a thickness of 1 µm or so on the surface of ferrite which is to become the core 30 by electroless plating. Further, iron is formed to a thickness of 10 µm on the surface of said film of Ni.P alloy by electroplating. The coil 39 is attached to the inner surface of the core 30 thus formed.

Next, an operation of the electro-magnetic lens in FIG. 5 will be described below.

When the focal length of the electro-magnetic lens is to be adjusted, a current flowing through the coil 39 of the electro-magnetic lens is changed, and the magnetic fields generated in the two magnetic poles 30a and 30b of the core 30 are changed accordingly. It requires some time until the magnetic fields are stabilized in the conventional electro-magnetic lens. In this embodiment, ferrite is used for the core 30 itself in order to shorten the above-mentioned time. However, since the surface smoothers 33A and 33B are additionally formed on the surface of the core 30 of ferrite, the influences therefrom must be taken into consideration.

When the current flowing through the coil 39 is adjusted in order to change the focal length of the lens, a magnetic flux which passes through the ferrite and a magnetic flux which passes through spaces outside the ferrite, and thus the magnetic field make a response to the adjustment in a several µsec. A thin layer made of Permalloy (or iron, or the like) such as the surface smoother 33A or 33B has a lower response characteristic because of an eddy current flowing. However, the response characteristic R when, for example, a magnetic flux flows through the two magnetic materials is expressed by a weighted average of the time constants of the respective materials related to the length of the corresponding magnetic paths, as shown in the following equation:

$$R=(1-A)(1-\exp(-\alpha t))+A(1-\exp(-\beta t)) \quad (1)$$

where A is a constant representing a ratio between the thickness of the surface smoother 33A or 33B and the length of the magnetic field, α is the time constant of ferrite, β is the time constant of the surface smoother 33A or 33B, and t is time.

The length of a magnetic path of the electro-magnetic lens in the present embodiment is 1 m or so, and a response is reduced only in a part of the magnetic path on the order of 10 to 100 µm or so of the surface smoothers 33A and 33B. As a result, $A<<(1-A)$ is established. Therefore, the second term of the equation (1) is negligible. That is, the electro-magnetic lens has substantially the same response characteristic as the case in which the core of the electro-magnetic lens is made of ferrite only (shown in FIGS. 1 to 4).

Though the ferrite in the inner part of the core 30 has voids, the surface of the core 30 is covered with the surface smoothers 33A and 33B finished as 10 mirror surfaces so as to achieve the smooth surface of the core. Therefore, a flux of magnetic lines of force is not bent in an abnormal manner, and the lens characteristics are stable.

As described above, the electro-magnetic lens in the present embodiment has, since the surface of the core 30 of the lens made of ferrite is covered with the surface smoothers 33A and 33B, excellent lens characteristics and a high response characteristic. In addition, this lens can be manufactured easily.

The electro-magnetic lens of the present embodiment having the above-mentioned structure (FIG. 5) can be applied to at least one of the first and second electro-magnetic lenses 8 and 9 of the electron beam demagnification transferring apparatus shown in FIG. 1, in entirely the same manner as the foregoing first embodiment. For example, when the first electro-magnetic lens 8 shown in FIG. 1 is replaced with the electro-magnetic lens shown in FIG. 5, even if a current to be supplied to the coil 8A of said first electro-magnetic lens 8 is adjusted, the magnetic field is quickly stabilized and the throughput is improved. Further, a pattern image with extremely small deformation (that is, having high quality) and with high resolving power can be projected because of the surface smoothers 33A and 33B.

At least one of the first and second deflectors 5 and 11 of the electron beam demagnification transferring apparatus shown in FIG. 1 may have a core made of ferrite, in entirely the same manner as the electro-magnetic lens in the present embodiment (FIG. 5), and the surface of said core may be covered with a ferromagnetic material. In this manner, the response characteristic of the first and second deflectors 5 and 11 can be improved and, in addition, the throughput can be also improved. In this case, the second deflector 11 may have a core common to the core 8A of the first electro-magnetic lens 8 which is made of ferrite and covered with a ferromagnetic material.

What is claimed is:

1. An electro-magnetic lens comprising:

a coil;

a core made of ferrite and having two magnetic poles, said coil being received by said core;

and an electrically insulating support member disposed between said coil and an optical axis of the lens to support said magnetic poles.

2. An electro-magnetic lens according to claim 1, further comprising:

a device for supplying a temperature-controlled fluid to cool said coil.

3. An electro-magnetic lens comprising:

a coil; and a core made of ferrite and having two magnetic poles, said core having a surface-smoothing layer made of ferromagnetic material disposed on a surface portion thereof and which is effective to suppress magnetic flux irregularities due to lack of smoothness of said surface portion.

4. An electro-magnetic lens according to claim 3, wherein said ferromagnetic material includes at least one of iron, Permalloy, monocrystalline ferrite and ferric nitride expressed by the chemical formula FeNx (where $0<x\leq 1$).

5. An electro-magnetic lens according to claim 3, further comprising:

an electrically insulating support member disposed to support said magnetic poles.

6. An electro-magnetic lens according to claim 3, further comprising:

a device for supplying a temperature-controlled fluid to cool said coil.

7. An electro-magnetic lens according to claim 3, wherein a portion of said surface-smoothing layer is disposed between an axial end of said coil and a part of said surface portion that is opposed to said axial end of said coil.

8. A charged particle beam transferring apparatus comprising:

a pair of electro-magnetic lenses spaced apart in a direction of an optical axis, for emitting charged particle beams from a mask to a substrate, each of said electromagnetic lenses comprising a coil and a core made of a magnetic material and having two magnetic poles, said core of at least one of said electro-magnetic lenses being made of ferrite and having a surface-smoothing layer of ferromagnetic material disposed on a surface portion thereof and which is effective to suppress magnetic flux irregularities due to lack of smoothness of said surface portion.

9. An apparatus according to claim 8, wherein said ferromagnetic material includes at least one of iron, Permalloy, monocrystalline ferrite and ferric nitride expressed by the chemical formula FeNx (where $0<x\leq 1$).

10. An apparatus according to claim 8, further comprising:

an illuminating device for emitting charged particle beams to said mask, said illuminating device having a first deflector including a core made of ferrite, for deflecting said charged particle beams.

11. An apparatus according to claim 10, further comprising:

a second deflector for deflecting charged particle beams from said mask, said second deflector having a core common to the core of one of said electro-magnetic lenses.

12. An apparatus according to claim 11, wherein the core of said second deflector is made of ferrite and provided on an inner surface portion thereof with a surface-smoothing layer which is effective to suppress magnetic flux irregularities due to lack of smoothness of said inner surface portion.

13. An apparatus according to claim 8, further comprising:

a device for supplying a temperature-controlled fluid to at least one of said electro-magnetic lenses in order to cool the coil thereof.

14. An apparatus according to claim 13, wherein said supply device supplies said temperature-controlled fluid to the electro-magnetic lens nearer to said substrate.

15. An apparatus according to claim 8, further comprising:

a deflector for deflecting charged particle beams from said mask, said deflector having a core common to the core of one of said electromagnetic lenses.

16. An apparatus according to claim 8, further comprising:

a deflector for deflecting charged particle beams from said mask and having a core which is made of ferrite and which is provided on an inner surface portion thereof with a surface-smoothing layer which is effective to suppress magnetic flux irregularities due to lack of smoothness of said inner surface portion.

17. An apparatus according to claim 8, further comprising:

an electrically insulating support member disposed between the coil and an optical axis of one of said electro-magnetic lenses to support said magnetic poles of that lens.

18. An apparatus according to claim 8, wherein a portion of said surface-smoothing layer is disposed between an axial end of the coil of said one electromagnetic lens and a part of said surface portion that is opposed to said axial end of that coil.

19. A charged particle beam transferring apparatus comprising:

an electro-magnetic lens for emitting charged particle beams from a mask to a substrate and including a core made of ferrite and having two magnetic poles, and said core having a surface-smoothing layer made of ferromagnetic material on a surface portion thereof and which is effective to suppress magnetic flux irregularities due to lack of smoothness of said surface portion.

20. An apparatus according to claim 19, wherein said ferromagnetic material includes at least one of iron, Permalloy, monocrystalline ferrite and ferric nitride expressed by the chemical formula FeNx (where $0<x\leq 1$).

21. An apparatus according to claim 19, further comprising a coil received by said core, and wherein a portion of said surface-smoothing layer is disposed between an axial end of said coil and a part of said surface portion that is opposed to said axial end of said coil.

22. A method for manufacturing an electromagnetic lens, comprising:

bonding a surface-smoothing layer made of a ferromagnetic material on a surface portion of a core, made of ferrite and having two magnetic poles, through an adhesive; and attaching a coil to the core on which said layer is formed, said surface-smoothing layer being effective to suppress magnetic flux irregularities due to lack of smoothness of said surface portion.

23. A method according to claim 22, wherein said surface-smoothing layer and said coil are arranged such that a portion of said surface-smoothing layer is disposed between an axial end of said coil and a part of said surface portion that is opposed to said axial end of said coil.

24. A method of manufacturing an electro-magnetic lens, comprising:

forming a thin film surface-smoothing layer made of a ferromagnetic material on a surface portion of a core made of ferrite and having two magnetic poles by at least one of the methods of plating, vacuum evaporation, deposited injection, ion beam evaporation, sputtering, and reactive sputtering; and attaching a coil to the core on which said layer is formed, said surface-smoothing layer being effective to suppress magnetic flux irregularities due to lack of smoothness of said surface portion.

25. A method according to claim 24, wherein said surface-smoothing layer and said coil are arranged such that a portion of said surface-smoothing layer is disposed between an axial end of said coil and a part of said surface portion that is opposed to said axial end of said coil.

* * * * *